United States Patent [19]

Goodman et al.

[11] 4,455,565
[45] Jun. 19, 1984

[54] VERTICAL MOSFET WITH AN ALIGNED GATE ELECTRODE AND ALIGNED DRAIN SHIELD ELECTRODE

[75] Inventors: Alvin M. Goodman, Princeton; Ramon U. Martinelli, Hightstown, both of N.J.

[73] Assignee: RCA Corporation, New York, N.Y.

[21] Appl. No.: 234,834

[22] Filed: Feb. 13, 1981

Related U.S. Application Data

[63] Continuation of Ser. No. 123,715, Feb. 22, 1980.

[51] Int. Cl.³ .......................................... H01L 29/78
[52] U.S. Cl. ................................. 357/23.4; 357/23.8; 357/23.9; 357/23.14; 357/53; 357/86
[58] Field of Search ..................... 357/23, 52, 53, 86

[56] References Cited

U.S. PATENT DOCUMENTS

| | | | |
|---|---|---|---|
| 3,845,495 | 10/1974 | Cauge et al. | 357/23 UD |
| 4,172,260 | 10/1979 | Okabe et al. | 357/23 |

FOREIGN PATENT DOCUMENTS 53-74385  7/1978  Japan ............................. 357/23 UD

*Primary Examiner*—Joseph E. Clawson, Jr.
*Attorney, Agent, or Firm*—Birgit E. Morris; Donald S. Cohen; Kenneth R. Glick

[57] ABSTRACT

A vertical MOSFET includes source and gate electrodes on a major semiconductor surface, and a drain electrode on an opposing semiconductor surface. A shield electrode is disposed in proximity to the gate electrode so as to minimize feedback capacitance between the gate electrode and drain region. Additionally, the shield electrode increases the level of space charge limited current that can be supported in the drain region, and minimizes current crowding in the device.

5 Claims, 2 Drawing Figures

VERTICAL MOSFET WITH AN ALIGNED GATE ELECTRODE AND ALIGNED DRAIN SHIELD ELECTRODE

This is a continuation of application Ser. No. 123,715, filed Feb. 22,1980 abandoned.

BACKGROUND OF THE INVENTION

The present invention relates generally to insulated gate field effect transistors (IGFETS) such as metal oxide semiconductor FETS (MOSFETS). More particularly, it relates to vertical MOSFETS such as vertical, double diffused (VDMOS) devices.

A conventional IGFET is a unipolar transistor in which current flows from a source region, through a channel in a body region, into a drain region. The source, channel and drain regions are of N or P type conductivity, and the body region is of opposite conductivity type. The channel is induced (in an enhancement type device) or removed (in a depletion type device) by means of an electrostatic field produced by charges on a nearby gate electrode. The gate electrode typically lies between source and drain electrodes (disposed respectively on the source and drain regions), and in a MOSFET device it is insulated from the semiconductor surface by an oxide layer.

In vertical MOSFETS the source and drain electrodes are on opposite semiconductor surfaces and create a current flow which is substantially vertical (perpendicular to the semiconductor surfaces) through the device. In VDMOS devices the gate electrode is typically on the same semiconductor surface as the source electrode, a configuration which provides a component of horizontal current flow (through the channel under the gate) as well. However, the transition from horizontal to vertical current flow produces current crowding, an effect which impedes device performance by reducing the maximum achievable voltage gain.

Additionally, in conventional VDMOS structures the gate typically overlaps that portion of the drain region adjacent to the channel, producing a capacitance $C_{GD}$. When multiplied by the device gain $$\left(-\left(\frac{\delta V_D}{\delta V_G}\right)_{R_D}\right),$$

this capacitance is referred to as Miller-feedback capacitance, and it impairs device operation at high speeds and voltages.

To provide higher frequency and higher voltage operation, the present invention introduces a structure which reduces both Miller-feedback capacitance and current crowding in vertical MOSFET devices.

SUMMARY OF THE INVENTION

A shield electrode is disposed so as to reduce the capacitance between the drain region and gate, and minimize the current crowding, in a vertical MOSFET device. The shield is disposed in proximity to the gate electrode and it overlies that portion of the drain region which is adjacent to the channel portion of the device.

DETAILED DESCRIPTION

Figure 1:
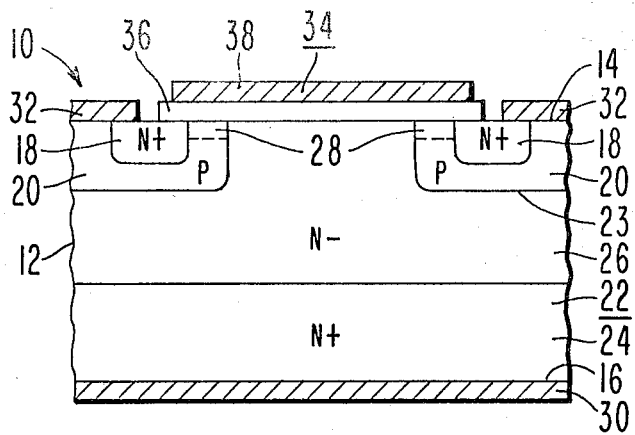
FIG. 1 is a sectional view of a prior art VDMOS device.

Referring to FIG. 1, a conventional VDMOS device 10 includes a substantially planar substrate 12 having first and second opposing surfaces (14 and 16 respectively), and adjacent source, body and drain regions (18, 20 and 22 respectively) of alternate conductivity type. The drain region 22 typically comprises a relatively high conductivity portion 24 adjacent to the second surface 16 and an extended drain portion 26 of lower conductivity material extending to the first surface 14. In a typical configuration, a pair of body regions 20, spaced apart by the extended drain region 26, extends into the substrate from the first surface 14 and forms a pair of body/drain PN junctions 23. A corresponding pair of source regions 18 extends into the substrate from the first surface 14 within the boundaries of the body regions 20. The source regions are located with respect to the extended drain region therebetween so as to define a pair of channel portions 28 at the first surface of each body region 20.

A drain electrode 30 is disposed across the second surface 16 and contacts the relatively high conductivity portion of the drain region 24. On the first surface a source electrode 32 contacts each source region 18 and body region 20 in an area displaced from the channel portion 28. A gate 34 is disposed on the first surface over both the pair of chanel portions 28 and the extended drain region 26 between the channel portions. The gate 34 typically includes an oxide 36 on the substrate surface 14 and an electrode 38 over the oxide.

Figure 2:
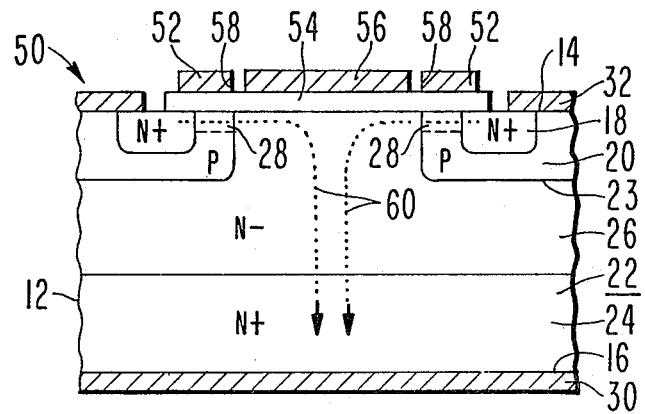
FIG. 2 is a sectional view of a VDMOS device embodying the present invention.

Referring now to FIG. 2, a VDMOS device 50 embodying the present invention is illustrated. Internally the semiconductor structure of device 50 is substantially similar to that described with reference to the prior art device 10. Accordingly, the same reference numerals have been used to designate similar semiconductor regions. Furthermore, the device 50 also includes a drain electrode 30 contacting the relatively high conductivity drain region 24 at the second surface 16, and a source electrode 32 contacting each source and body region (18 and 22 respectively) on the first surface 14. A gate electrode 52 is disposed over each channel portion 28 and is insulated from the first surface by an oxide 54.

In the present invention an insulated shield electrode 56 is disposed over the first surface such that it overlies the portion of the extended drain region 26 adjacent to the channel portions 28. In the preferred configuration an edge of each gate electrode 58 directly overlies the body/drain junction 23 and the shield electrode 56 is in proximity to, but isolated from, that edge. The shield electrode 56 is insulated from the first surface 14 by the same oxide 54 used to insulate the gate electrodes 52, although it is not necessary that the shield and gate electrodes be disposed on a single continuous oxide layer. In a typical device 50, the channel length is on the order of 5 microns, the oxide 54 thickness is approximately 1,000 Angstroms, and the spacing between the gate and shield electrodes is in the approximate range of 1,000 Angstroms to 5 microns.

The device 50 can be fabricated utilizing techniques commonly known in the semiconductor industry. For example, a conventional VDMOS device manufacturing method is described in U.S. Pat. No. 4,055,884, Fabrication Of Power Field Effect Transistors And The Resulting Structures, issued Nov. 1, 1977 to C. G. Jambotkar. To obtain the structure of the present invention additionally requires the pattern generation and formation of the shield electrode 56 and it can be performed in much the same manner as the fabrication of a standard gate electrode.

It should be noted that the described VDMOS device 50, comprising a pair of body and source regions, represents a preferred embodiment of the present invention. A device incorporating a single body and source region would also be functional. Furthermore, although the drawings illustrate semiconductor regions of a particular conductivity type (an N channel device), an operational (P channel) device would result if all indicated conductivity types were reversed.

It should also be recognized that the VDMOS device 50 can be incorporated into a larger device. For example, the larger device can include a plurality of portions, each having the sectional view of the VDMOS device 50 illustrated in FIG. 2. This plurality of devices might be in the form of an interdigitated, grid, or meandering gate structure, as is commonly known in the semiconductor art.

The vertical VDMOS device 50 is particularly suitable for high power, high frequency operation and it can be used in either an enhancement or depletion mode. For example, under a set of typical operating conditions for an N channel enhancement mode device, the source electrode 32 is grounded, the drain electrode 16 is at 400 volts and the gate electrode 52 oscillates from 0 to 30 volts at frequencies on the order of 100 MHz. The shield electrode 56 is maintained at a substantially constant positive bias, similar in magnitude, but typically larger than, the gate bias. In the present example, the shield electrode should be maintained in the 30–60 volt range.

Current flow 60 in the device is substantially vertical (i.e., perpendicular to the major surfaces 14 and 16) although it has a horizontal component as well. Charge carriers flow essentially horizontally from the source regions 18 through the channel portions 28 to the extended drain region 26, and then substantially vertically through the drain region 22 to the drain electrode 30.

The presence of the shield electrode 56 significantly improves the performance of device 50. As previously indicated, in the conventional device 10 the gate electrode 38 overlaps the extended drain region 26 on the first surface 14, creating undesirable Miller-feedback capacitance during device operation. In the device 50 of the present invention Miller-feedback capacitance is minimized because the gate electrodes 58 are essentially disposed only over the channel portions 28. Although the shield electrode 56 overlaps the extended drain 26, it is maintained at a constant voltage (rather than the typically oscillating voltage of the gate 34), so it does not contribute to the feedback capacitance.

Additionally, the shield electrode 56 minimizes current crowding and increases the level of space charge limited current that can be supported in the extended drain region 26. Current crowding, accompanied by an intensification of electric field, results during the transition from horizontal current flow (through the channels 28) to vertical current flow (through the extended drain region 26). It is most acute in the areas where the PN junctions 23 intercept the first surface 14. Space charge limited current in the extended drain 26 is a function of the number of majority charge carriers in the area.

During operation of the device 50, the presence of the shield electrode 56 over the extended drain 26 creates a constant electrostatic field at the surface 14 of the extended drain. This field attracts majority charge carriers to the area, increasing the conductivity and enhancing the space charge limited current at the surface 14 of the extended drain. The shield electrode reduces the current crowding in the extended drain to the extent that it provides an electrostatic field greater than that produced by the oscillating gate voltage.

The invention has thus been described with reference to vertical, VDMOS structures. However, the invention is not so limited. It should be recognized that a shield electrode can be used in vertical, V groove (VMOS) structures and planar MOS structures as well. In VMOS and planar MOS structures, the shield electrode will also overlie that portion of the extended drain region adjacent to the channel portion of the body region. It will again minimize Miller-feedback capacitance and current crowding, while increasing the level of space charge limited current in the drain region.

What is claimed is:

1. A vertical MOSFET device, comprising:
   a semiconductor substrate having first and second opposing major surfaces;
   a drain region of first conductivity type disposed across the second surface and including an extended drain portion extending to the first surface;
   a body region of second conductivity type extending into the substrate from the first surface and being bounded by the extended drain portion;
   a source region of first conductivity type extending into the substrate from the first surface within the boundaries of the body region;
   a channel portion, defined at the first surface by the source region and the extended drain portion;
   a source electrode contacting the source and body regions on the first surface;
   a drain electrode contacting the drain region on the second surface;
   an insulated gate electrode disposed on the first surface over the channel portion and spaced from said extended drain portion; and
   a shield electrode overlying only said extended drain portion on the first surface.

2. The device of claim 1 wherein:
   the drain region includes a substantially planar portion of relatively high conductivity at the second surface.

3. A vertical MOSFET device, comprising:
   a semiconductor substrate having first and second opposing major surfaces;
   a drain region of first conductivity type disposed across the second surface and including an extended drain portion extending to the first surface;
   a pair of body regions of second conductivity type extending into the substrate from the first surface, the body regions being spaced apart by the extended drain portion;
   a pair of source regions, each extending into the substrate from the first surface within the boundaries of a body region;
   a pair of channel portions, defined at the first surface by the pair of source regions and the extended drain portion therebetween;

a source electrode contacting the source and body regions on the first surface;

a drain electrode contacting the drain region on the second surface;

a pair of insulated gate electrodes disposed on the first surface over the pair of channel portions and spaced from said extended drain portion; and a shield electrode overlying only said extended drain portion on the first surface.

4. The device of claim 3 further comprising:

an oxide layer underlying the gate and shield electrodes; and a pair of source electrodes disposed on the first surface.

5. A vertical MOSFET device, comprising:

a semiconductor substrate having first and second opposing major surfaces;

a drain region of first conductivity type disposed across the second surface and including an extended drain portion extending to the first surface;

a pair of body regions of second conductivity type extending into the substrate from the first surface, the body regions being spaced apart by the extended drain portion;

a pair of source regions, each extending into the substrate from the first surface within the boundaries of a body region;

a pair of channel portions, defined at the first surface by the pair of source regions and the extended drain portion therebetween;

a source electrode contacting the source and body regions on the first surface;

a drain electrode contacting the drain region on the second surface;

an insulated gate electrode disposed on the first surface over the pair of channel portions and spaced from said extended drain portion; and a shield electrode overlying only said extended drain portion on the first surface.

* * * * *